(12) United States Patent
Tien et al.

(10) Patent No.: US 7,994,580 B2
(45) Date of Patent: Aug. 9, 2011

(54) HIGH VOLTAGE TRANSISTOR WITH IMPROVED DRIVING CURRENT

(75) Inventors: William Wei-Yuan Tien, Hsinchu (TW); Fu-Hsin Chen, Jhudong Township (TW); Jui-Wen Lin, Taichung (TW); You-Kuo Wu, Sijhih (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 459 days.

(21) Appl. No.: 11/253,919

(22) Filed: Oct. 19, 2005

(65) Prior Publication Data

US 2007/0085145 A1 Apr. 19, 2007

(51) Int. Cl.
*H01L 29/94* (2006.01)
(52) U.S. Cl. .................. 257/368; 257/500; 257/E29.268
(58) Field of Classification Search ........... 257/E21.427, 257/E29.268, 368, 500
See application file for complete search history.

(56) References Cited

U.S. PATENT DOCUMENTS

| | | | |
|---|---|---|---|
| 5,436,483 A | 7/1995 | Iwai et al. | |
| 5,573,965 A * | 11/1996 | Chen et al. | 438/297 |
| 5,585,293 A * | 12/1996 | Sharma et al. | 438/261 |
| 6,091,111 A | 7/2000 | Demirlioglu et al. | |
| 6,124,159 A | 9/2000 | Chu | |
| 6,144,538 A | 11/2000 | Chao | |
| 6,277,694 B1 | 8/2001 | Wu | |
| 6,297,108 B1 | 10/2001 | Chu | |
| 6,333,234 B1 | 12/2001 | Liu | |
| 6,350,641 B1 | 2/2002 | Yang | |
| 6,492,234 B1 * | 12/2002 | Moroni et al. | 438/305 |
| 6,713,338 B2 * | 3/2004 | Wang et al. | 438/231 |
| 6,724,052 B2 * | 4/2004 | Cho et al. | 257/384 |
| 6,815,320 B2 * | 11/2004 | Kim et al. | 438/585 |
| 2002/0190284 A1 * | 12/2002 | Murthy et al. | 257/286 |
| 2003/0127694 A1 * | 7/2003 | Morton et al. | 257/371 |
| 2003/0235966 A1 * | 12/2003 | Kim et al. | 438/305 |
| 2005/0112826 A1 | 5/2005 | Chen et al. | |
| 2005/0118768 A1 | 6/2005 | Chen | |
| 2005/0142717 A1 | 6/2005 | Rabkin et al. | |

* cited by examiner

*Primary Examiner* — Colleen A Matthews
(74) *Attorney, Agent, or Firm* — Slater & Matsil, L.L.P.

(57) ABSTRACT

A semiconductor device and its method of manufacture are provided. Embodiments include forming a first doped region and a second doped region. The first and second doped regions may form a double diffused drain structure as in an HVMOS transistor. A gate-side boundary of the first doped region underlies part of the gate electrode. The second doped region is formed within the first doped region adjacent the gate electrode. A gate-side boundary of the second doped region is separated from a closest edge of a gate electrode spacer by a first distance. An isolation region-side boundary of the second doped region is separated from a closest edge of a nearest isolation region by a second distance.

16 Claims, 5 Drawing Sheets

HIGH VOLTAGE TRANSISTOR WITH IMPROVED DRIVING CURRENT

CROSS-REFERENCE TO RELATED APPLICATIONS

This application is related to co-pending and commonly assigned U.S. patent application Ser. No. 10/723,771, Method of Fabricating High Voltage Transistor by F. H. Chen et al., which application is hereby incorporated by reference in its entirety.

TECHNICAL FIELD

This invention generally relates to semiconductor devices and more particularly to high voltage metal-oxide semiconductor transistors.

BACKGROUND

Power devices such as a liquid crystal displays (LCDs) and driver ICs require both low voltage (LV) operation for driving an associated logic circuit and high voltage (HV) operation for driving the LCD during operation. A double diffused drain MOS (DDDMOS) is a popular HV structure for devices having an operating voltage less than about 20 volts. Driving current (Idsat) is an important performance parameter for HV devices. It is desirable to have a high and stable driving current, particularly for high-speed or high frequency applications.

Illustrated in FIG. 1 is a conventional HVMOS transistor, which includes a substrate 1 wherein field oxide regions 2 have been formed. The transistor includes a source 3 that comprises an N+ or P+ (N+/P+) region 4. The drain 5 of the transistor comprises a first diffusion region 6 and a second diffusion region 7, as shown. The first diffusion region 6 may comprise an NDD or PDD (NDD/PDD) region comprising an n/p type double diffused region, for example. A lightly doped NLDD or PLDD (NLDD/PLDD) region comprising an n/p type lightly doped double diffused region 8 may also be formed in the source 3, such as shown. A channel region 9 resides between the source 3 and the drain 5, beneath the gate oxide 10 and the gate 11. Spacers 12 are formed on either side of the gate electrode 11.

A problem with the HVMOS transistor shown in FIG. 1 is that the etching process used to form the spacers 12 has bad selectivity. Therefore, the etching forms a surface damage region 15 within the substrate 1. Since the NDD/PDD region 6 is a lightly doped region, surface damage region 15 causes Idsat to drop. Also, the spacer-etching rate has ring type performance, the etching rate at the wafer center is different compared to that of the wafer edge, and so it makes the Idsat value low and its uniformity very poor. Poor etch selectivity also causes oxide depletion 13 from the isolation regions 2 and poly damage 16 at the gate electrode 11. Conventional methods and structures may therefore suffer from performance degradation and reduced reliability.

What is needed in the art are improved methods of forming double diffused drain structures and improved double diffused drain structures, particularly in relation to HV transistors.

SUMMARY OF THE INVENTION

These and other problems are generally solved or circumvented, and technical advantages are generally achieved by preferred embodiments of the present invention that provide a method of fabricating a high voltage transistor.

In accordance with embodiments of the invention, a high voltage semiconductor device and its method of manufacture are provided. The device comprises an active region in a semiconductor substrate. Preferably, an isolation region bounds the active region. A gate electrode is formed over the active region, and at least one dielectric layer is formed over sidewalls of the gate electrode. A pair of spacers is formed on the dielectric layer. A preferred embodiment comprises a first doped region within the active region, wherein the first doped region comprises a portion underlying one of the spacers and a portion adjacent the one of the spacers. A preferred embodiment of the invention may also comprise a second doped region substantially within the portion of the first doped region adjacent the one of the spacers, wherein the second doped region is spaced apart from the one of the spacers. The first and second doped regions may form a double diffused drain (DDD) structure as in an HVMOS transistor.

In an embodiment of the invention, a gate-side boundary of the second doped region is separated from a closest edge of the one of the spacers by a distance, which is preferably greater than about 0.2 μm. An isolation region-side boundary of the second doped region may be separated from a closest edge of the isolation region.

Other embodiments of the invention provide a semiconductor device and a method of manufacture. The device preferably comprises forming an isolation region around an active region in a substrate and a gate electrode formed over the active region. Preferred embodiments may include a DDD region formed within the active region, the DDD region being located between the gate electrode and the isolation region. Embodiments may include a first dielectric layer formed along sidewalls of the gate electrode and over a portion of DDD region, and a second dielectric layer formed over the first dielectric layer. A pair of gate electrode spacers are formed over the second dielectric layer along sidewalls of the gate electrode. Preferred embodiments include a second doped region formed within the DDD region, wherein the second doped region is spaced apart from the gate electrode spacer and the isolation region. Preferably, the spacing is greater than about 0.2 μm.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise

DETAILED DESCRIPTION OF ILLUSTRATIVE EMBODIMENTS

Figure 1:
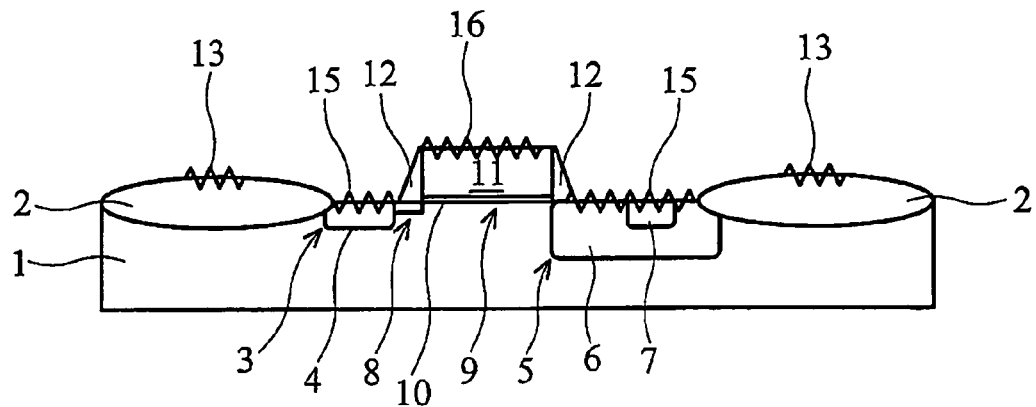
FIG. 1 is a cross-section view of a conventional HVMOS transistor.

Referring now to the drawings, wherein like reference numbers are used herein to designate like elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Figure 2:
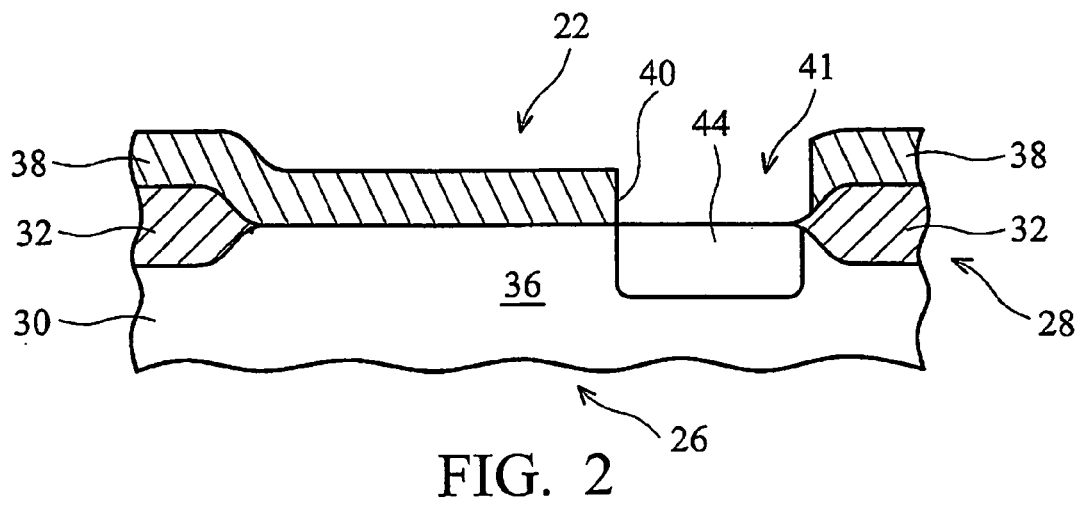
FIGS. 2-9 show cross-sectional views of an HVMOS transistor being formed according to embodiments of the invention.

Referring to FIG. 2, which shows a HVMOS device 26 at an intermediate fabrication stage, this description begins with an initial structure 28 that has had other preliminary and/or conventional processing steps performed on it. The initial structure 28 has a substrate 30, which may have isolation regions 32 formed therein. In this example, the isolation regions 32 have been formed at the beginning of the process, which is typically preferred. In other embodiments, however, the isolation regions 32 may be formed at a later stage in the process. In this example, the isolation regions 32 have a field oxide structure. The isolation regions 32 may be formed with other structures, however, such as a shallow trench isolation structure, for example. In this example, the isolation regions 32 surround and define boundaries for the active region where the transistors will reside. Often the isolation regions 32 have a generally rectangular box shape from a top view (not shown), for example.

The substrate 30 of the initial structure 28 preferably has P/N type well regions 36 at the active region 22 where the transistors will be formed. "P/N" indicates that the well region 36 may be P type or N type. In FIG. 2, the initial structure 28 has a first patterned mask layer 38 formed thereon. The first mask layer 38 may be made from any of a variety of suitable masking materials, such as photoresist, for example. The first mask layer 38 has a first opening 40 formed therein (e.g., by photolithography and etching) at a first location 41. As shown in FIG. 2, the substrate 30 may be implanted with ions at the first location 41 through the first opening 40 to form a first doped region 44. The first doped region 44 may be N type or P type, and it may have a dopant concentration between about $10^{12}$ cm$^{-3}$ and $10^{13}$ cm$^{-3}$ and a depth between about 20 angstroms and 2000 angstroms. Typically, if the substrate 30 has a P type well region 36, the first doped region 44 will be an N type doped region. And vice versa, if the substrate 30 has an N type well region 36, the first doped region 44 likely will be a P type doped region. The first mask layer 38 is preferably removed next.

Figure 3:
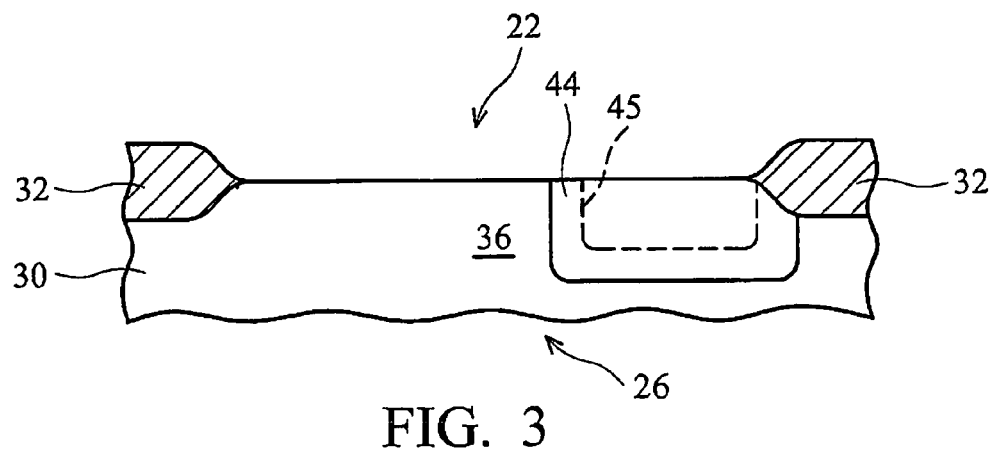

Referring to FIG. 3, the first doped region 44 may be enlarged by driving in the implanted ions further into the substrate 30. In FIG. 3, the former size of the first doped region 44 prior to the thermal driving-in step is shown in phantom lines 45 for purposes of illustrating the enlargement. The thermal driving-in step may be performed at a temperature between about 1000° C. and 1200° C., for example. Using a temperature of about 1100° C. is preferred for the thermal driving-in step. The thermal driving-in step may be performed for about 6-8 hours at atmospheric pressure, for example. As a result of the thermal driving-in step, boundaries of the first doped region 44 become graded, which is desirable for many HVMOS transistor applications. In FIG. 3, the first mask layer 38 has been removed. The first mask layer 38 may be removed before, during, and/or after the thermally driving-in step.

Figure 4:
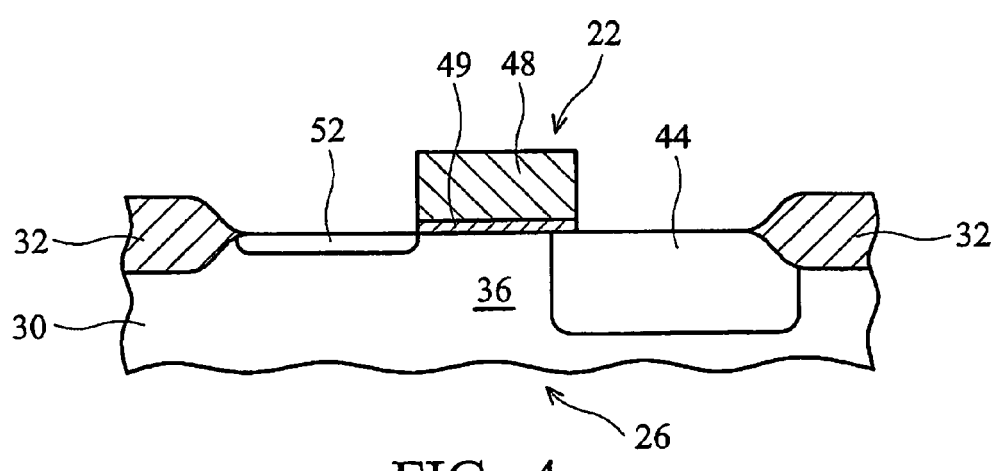

Next referring to FIG. 4, a gate electrode 48 formed over the substrate 30 of the intermediate HVMOS device after the thermally driving-in step. Between the gate electrode 48 and the substrate 30 there may be formed a gate dielectric layer 49, such as a gate oxide or other dielectric conventionally used. Preferably, at least part of the gate electrode 48 is located in the active region 22. Preferably, at least part of the gate electrode 48 extends over a part of the first doped region 44, as shown in FIG. 4. Although it may be preferable to form the gate electrode 48 after the thermally driving-in step (as shown here), in other embodiments the gate electrode 48 may be formed before the thermally driving-in step or before the implanting of ions for the first doped region 44, for example.

Continuing with FIG. 4, the substrate 30 may be implanted with ions at the active region 22 in alignment with edges of the gate electrode 48 and edges of the isolation region 32 to form a lightly doped region 52. The lightly doped region 52 may be N type or P type lightly doped region. Typically, if the substrate 30 has a P type well region 36, the lightly doped region 52 will be an N type lightly doped region. And vice versa, if the substrate 30 has an N type well region 36, the lightly doped region 52 likely will be a P type lightly doped region.

Figure 5:
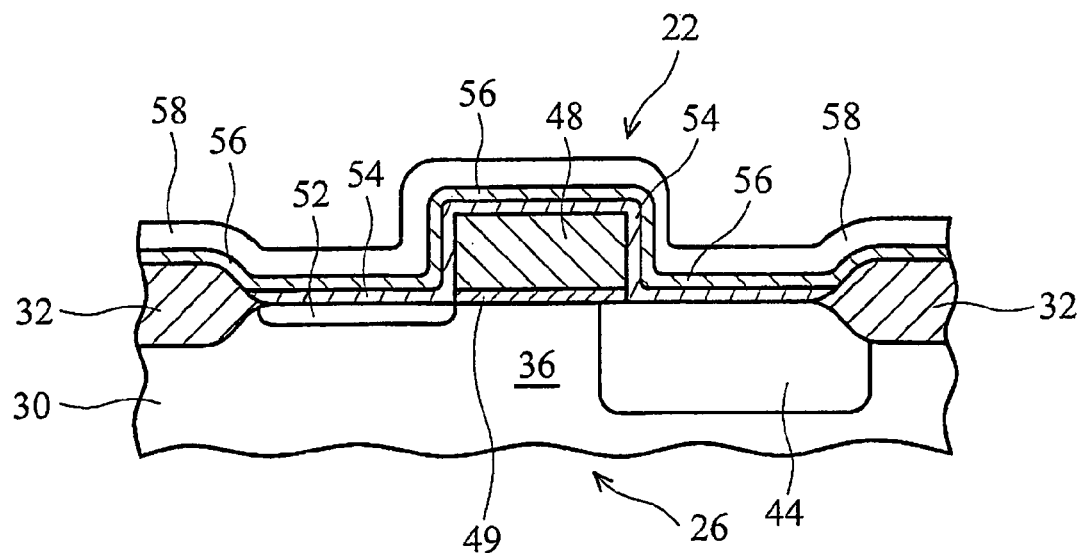

Turning now to FIG. 5, at least one dielectric layer is formed over the HVMOS device 26. A preferred embodiment of the invention comprises forming a first dielectric layer 54 over the HVMOS device 26 including over opposite sidewalls of the gate electrode 48. Embodiments may further comprise forming a second dielectric layer 56 over the first dielectric layer 54. In one embodiment, the first and second dielectric layers 54, 56 may be an oxygen-containing dielectric, such CVD silicon oxide. In another embodiment, the first and second dielectric layers 54, 56 may independently comprise a nitrogen-containing dielectric, an oxygen-containing dielectric, an oxide layer, a silicon nitride layer, or combinations thereof. Suitable nitrogen-containing dielectrics may include silicon nitride or silicon oxynitride. The second dielectric layer 56 is preferably silicon nitride ($Si_3N_4$) deposited by plasma-enhanced CVD (PECVD). The second dielectric layer 56 may have a thickness between about 20 angstroms and 300 angstroms.

A spacer dielectric layer 58 is formed over the second dielectric layer 56; In one embodiment, the spacer dielectric layer 58 may be a nitrogen-containing dielectric. In another embodiment, the spacer dielectric layer 58 may be an oxygen-containing dielectric. The spacer dielectric layer 58 may be silicon oxide, silicon nitride, or silicon oxynitride. The spacer dielectric layer 58 preferably comprises a TEOS film formed through LPCVD decomposition of a tetraethoxysilane precursor. Anisotropically etching the spacer dielectric layer 58 from horizontal surfaces leaves gate electrode spacers 60, the gate electrode spacers 60 may preferably have a thickness between about 200 angstroms and 3000 angstroms, as shown in FIG. 6.

Figure 6:
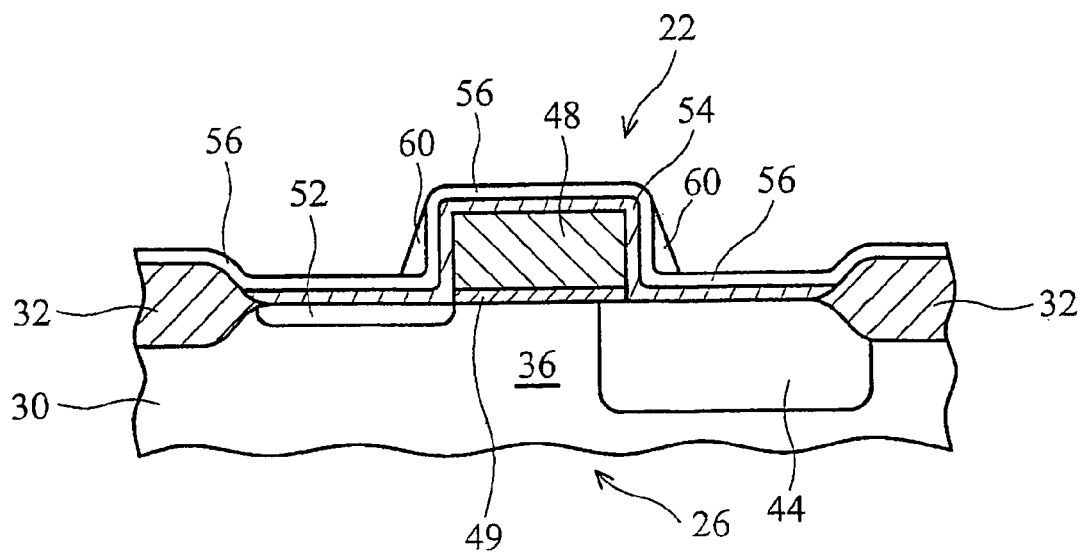

As shown in FIG. 6, one purpose of the second dielectric layer 56 is to function as an etch stop layer (ESL) during spacer 60 formation. As noted above, one problem with conventional methods of spacer 60 formation is substrate 30 surface damage caused by poor etch selectivity. In particular, surface damage within source/drain regions (e.g., 52 and 54) causes Idsat to drop. The second dielectric layer 56 of preferred embodiments of the invention advantageously prevents such problems.

Figure 7:
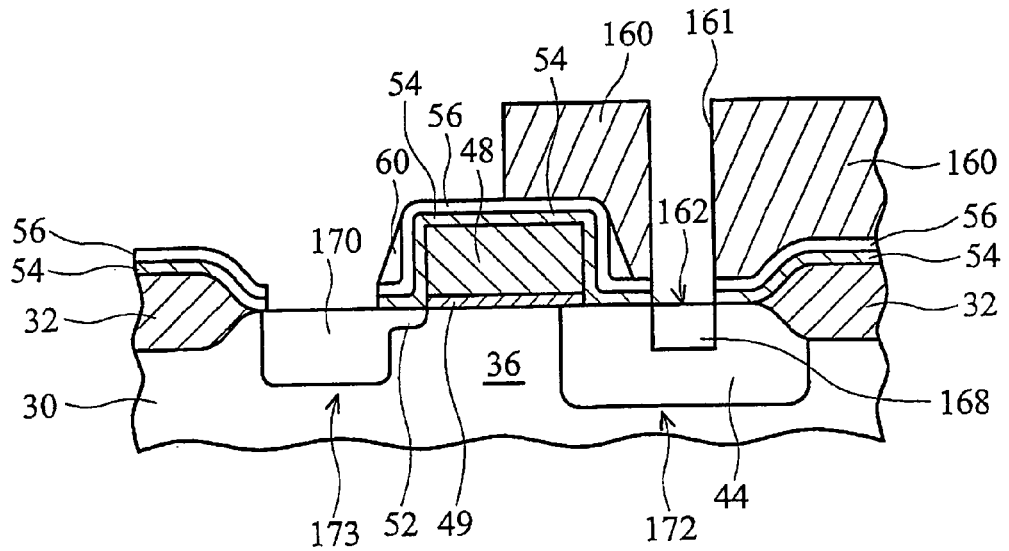

Turning now to FIG. 7, after forming the spacers 60, the first doped region 44 comprises a portion underlying one of the spacers and a portion adjacent the one of the spacers. Then, a second patterned mask layer 160 is formed over the intermediate HVMOS structure. The second mask layer 160 may be made from any of a variety of suitable masking materials, such as photoresist, for example. The second mask layer 160 has a second opening 161 formed therein at a second location 162 in the active region. The second opening 161 is formed through the first 54 and second 56 dielectric layers. The second location 162 is preferably located within the first doped region 44.

As shown in FIG. 7, the second opening 61 is preferably not aligned with either the spacer 60 or the isolation region 32. The substrate 30 is implanted with ions at the second location 162 through the second opening 161 to form a second doped region 168. The second doped region 168 is substantially within a portion of the first doped region 44 adjacent the one of the spacers. Preferably, the second doped region 168 is spaced apart from (i.e., not aligned with) the gate electrode spacer 60 or the isolation region 32. Preferably, the second dielectric layer 56 and the spacer 60 are over the first doped region 44.

As shown in FIG. 7, other regions, such as a third doped region 170, are also implanted with ions when the second doped region 168 is implanted with ions. The second doped region 168 and the third doped regions 170 are preferably N+ type or P+ type. They may have a dopant concentration between about $10^{14}$ and $10^{16}$ cm$^{-3}$ and a depth between about 20 and 200 angstroms. Typically, if the substrate 30 has a P type well region 36, the second doped region 168 will be an N+ type doped region. And vice versa, if the substrate 30 has an N type well region 36, the second doped region 168 likely will be a P+ type doped region. The first and second doped regions 44, 168 form a double diffused drain (DDD) structure 172. The third doped region 170 and the lightly doped region 52 form a source region 173. The DDD structure 172 and the source region 173 may be either symmetrically or asymmetrically disposed about the gate electrode 48.

Figure 8:
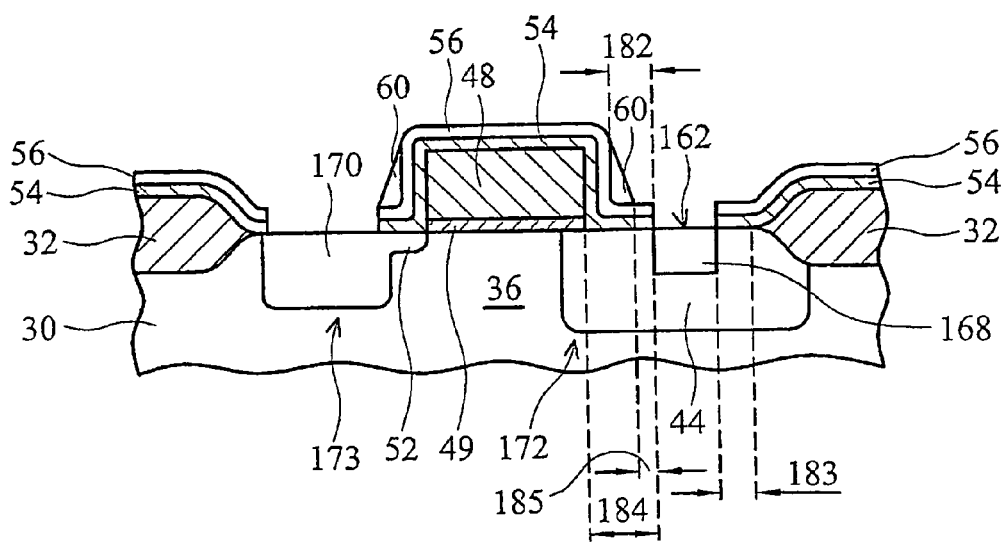

FIG. 8 is a cross sectional view of the structure of FIG. 7 after removal of the second masking layer 160. In embodiments of the invention, the layout of the HVMOS device may vary depending upon the desired operation voltage. Generally, an HVMOS transistor designed for a higher operation voltage may have an operating voltage greater than 20 or even 40 volts, for example. In an embodiment of the invention, an isolation-side boundary of the second doped region 168 may be separated from a closest edge of the isolation region 32 by a first distance 183, as shown in FIG. 8, the first distance 183 may be greater than about 0.2 μm, for example.

In other embodiments, a second distance 185 is defined as a distance between the gate-side boundary of the second doped region 168 and a nearest edge of the gate electrode spacer 60 as shown in FIG. 8. The second distance 185 may be greater than about 0.2 μm, for example. In other embodiments, the gate-side boundary of the second doped region 168 is preferably separated from a closest edge of the second dielectric layer 56 by a third distance 182. The third distance 182 may be greater than about 0.22 μm, for example. In still other embodiments, a gate-side boundary of the second doped region 168 is preferably separated from a closest edge of the gate electrode 48 by a fourth distance 184. The fourth distance 184 may be greater than about 0.25 μm, for example.

Figure 9:
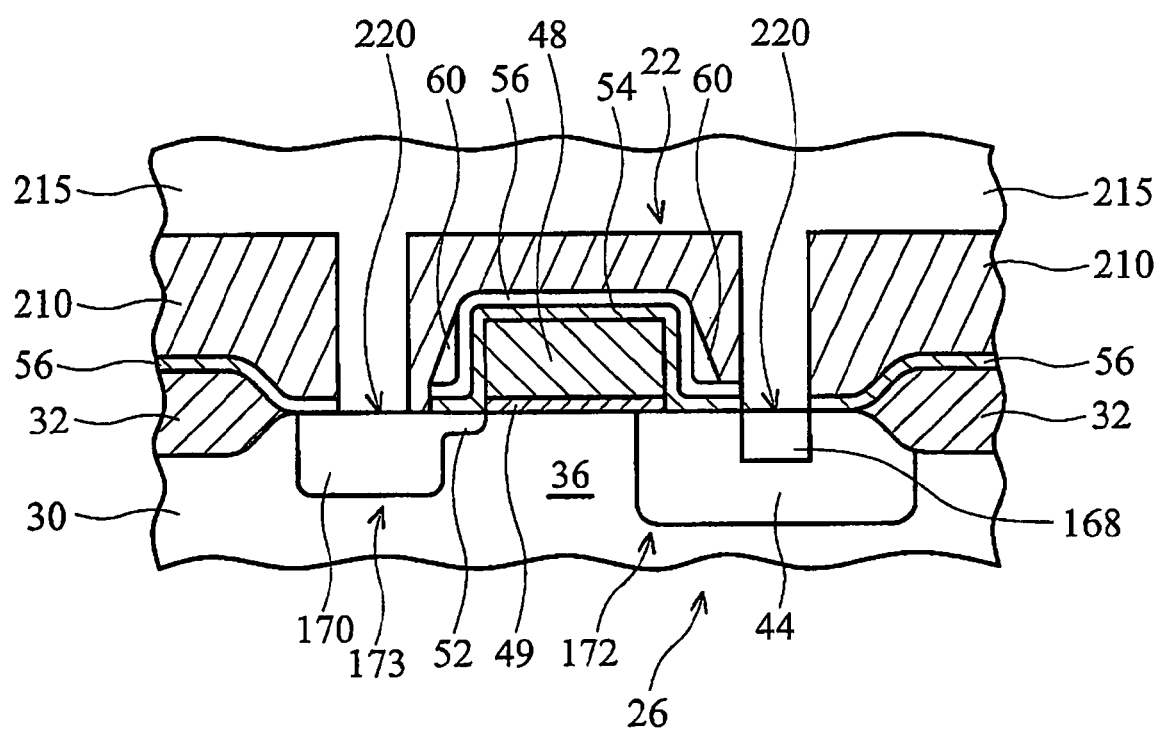

After completing the previous steps, an interlevel dielectric (ILD) layer 210 may be formed over the HVMOS structure as shown in FIG. 9. The ILD layer 210 may include low-k dielectrics such as organo silicate glass (OSG), fluorinated silicate glass (FSG), hydrogen silsequioxane (HSQ), methyl silsesquioxane (MSQ), or porous dielectrics. Over the ILD layer 210 there may be formed a first metallization layer 215. The metallization forming preferably further includes forming silicide contact regions 220 over and/or within the second doped region 168 and the third doped region 170. The silicide contact region 220 may comprise a refractory metal such as Ti, Co, and/or Ni.

As described above, conventional spacer etching often has poor selectivity. Etching consumes dopant from source/drain regions thereby causing Idsat to drop in addition to other device problems. Embodiments of the invention advantageously improve HVMOS performance.

For example, a driving current performance comparison compared conventional silicon 0.5 μm 12V/5V HVMOS devices (no $Si_3N_4$ protection layer) with devices formed according to embodiments of the invention. Conventional devices had a mean Idsat equal to 6.389 mA. Uniformity, as indicated by the Idsat standard deviation, for conventional devices was 0.455 mA. According to silicon HVNMOS test data of preferred devices, which included the Si3N4 protection layer, Idsat mean value improved to 7.357 mA (~15% increase). The Idsat standard deviation was reduced to 0.059 mA (~87% reduction). In summary, HVNMOS devices according to preferred embodiments displayed a 15% improvement in mean driving current and an 87% reduction in non-uniformity over conventional devices.

Although only an asymmetrical HVMOS transistor has been shown in the example embodiments herein (i.e., DDD on only one side (source or drain) of transistor), in other embodiments of the present invention the source and the drain may both have a DDD structure (i.e., one or both having a DDD in accordance with the present invention), or the HVMOS transistor may be symmetrical (i.e., source and drain both having identical DDD structures), for example.

The embodiments provided herein described a single HVMOS device being formed. However, other embodiments may include HVMOS transistor being formed in parallel with another device. For example, an HVMOS transistor may be formed in parallel with a low voltage MOS transistor. F. H. Chen et al. describe such a parallel fabrication process in co-pending and commonly assigned U.S. patent application Ser. No. 10/723,771, Method of Fabricating High Voltage Transistor.

It will be appreciated by those skilled in the art having the benefit of this disclosure that embodiments of the present invention provide an improved HVMOS transistor process and structure. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A high voltage semiconductor device comprising:
   an active region in a semiconductor substrate having a planar top surface, wherein the active region is bounded by an isolation region;
   a gate electrode over the active region having opposing sidewalls;
   a first dielectric layer over the sidewalls of the gate electrode, the first dielectric layer having upper portions overlying the sidewalls of the gate electrode and lower portions adjacent a bottom of the gate electrode, the lower portions of the first dielectric layer extending away from the bottom of the gate electrode and extending parallel to the planar top surface of the substrate;

an etch stop layer formed over the first dielectric layer over the sidewalls of the gate electrode, the etch stop layer having upper portions overlying the upper portions of the first dielectric layer and having lower portions adjacent the bottom of the gate electrode and the lower portions of the etch stop layer extending away from the bottom of the gate electrode and extending parallel to the planar top surface of the substrate;

a pair of spacers formed over the etch stop layer;

a first doped region within the active region and having a first depth, wherein the first doped region comprises a portion underlying one of the spacers and a portion adjacent the one of the spacers; and a second doped region substantially within the portion of the first doped region adjacent the one of the spacers and having a second depth less than the first depth, wherein the second doped region is spaced apart from the one of the spacers by a distance;

wherein the lower portions of the first dielectric and the lower portions of the etch stop layer extending away from the bottom of the gate electrode and extending parallel to the planar top surface of the substrate are further extending over an entire region corresponding to the distance wherein the second doped region is spaced apart from the one of the spacers.

2. The high voltage semiconductor device of claim 1, wherein a gate-side boundary of the second doped region is laterally separated from a closest edge of the one of the spacers by a distance, greater than about 0.2 µm.

3. The high voltage semiconductor device of claim 1, wherein an isolation region-side boundary of the second doped region is laterally separated from a closest edge of the isolation region.

4. The high voltage semiconductor device of claim 1, wherein the first dielectric layer comprises a material selected from the group consisting essentially of a nitrogen-containing dielectric, an oxygen-containing dielectric, an oxide layer, a silicon nitride layer, and combinations thereof.

5. The high voltage semiconductor device of claim 1, wherein the pair of the spacers comprises a material selected from the group consisting essentially of a nitrogen-containing dielectric, oxygen-containing dielectric, tetraethylorthosilicate (TEOS), and combinations thereof.

6. The high voltage semiconductor device of claim 1, wherein the first doped region has a dopant concentration between about $10^{12}$ cm$^{-3}$ and $10^{13}$ cm$^{-3}$, and wherein the first depth is between about 20 angstroms and about 2000 angstroms.

7. The high voltage semiconductor device of claim 1, wherein the second doped region has a dopant concentration between about $10^{14}$ cm$^{-3}$ and $10^{16}$ cm$^{-3}$, and the second depth is between about 20 angstroms and about 200 angstroms.

8. The high voltage semiconductor device of claim 1, further comprising a silicide region over the second doped region.

9. The high voltage semiconductor device of claim 8, wherein the silicide region comprises a refractory metal selected from the group consisting essentially of Ti, Co, Ni, and combinations thereof.

10. A semiconductor device comprising:
an isolation region around an active region in a substrate;
a gate electrode formed over the active region having sidewalls and the gate electrode having a bottom portion coplanar with a top surface of the substrate;
a double diffused drain (DDD) region formed within the active region, the DDD region being located between the gate electrode and the isolation region;
a first dielectric layer formed along the sidewalls of the gate electrode and over a portion of the DDD region, the first dielectric layer having upper portions overlying the sidewalls of the gate electrode and lower portions adjacent the bottom of the gate electrode, the lower portions of the first dielectric layer extending away from the bottom of the gate electrode and extending parallel to the planar top surface of the substrate;
a second dielectric layer over the first dielectric layer, the second dielectric layer having upper portions overlying the upper portions of the first dielectric layer and having lower portions adjacent the bottom of the gate electrode and the lower portions of the second dielectric layer extending away from the bottom of the gate electrode and extending parallel to the planar top surface of the substrate;
a pair of gate electrode spacers formed over the second dielectric layer along the sidewalls of the gate electrode; and
a second doped region formed within the DDD region, wherein the second doped region is spaced apart from one of the gate electrode spacers by a distance and spaced apart from the isolation region;
wherein the lower portions of the first dielectric and the lower portions of the second dielectric layer extending away from the bottom of the gate electrode and extending parallel to the planar to surface of the substrate are further extending over an entire region corresponding to the distance wherein the second doped region is spaced apart from the one of the gate electrode spacers.

11. The high voltage semiconductor device of claim 10, wherein a gate-side boundary of the second doped region is separated from a closest edge of the one of the gate electrode spacers by more about 0.2 µm.

12. The high voltage semiconductor device of claim 10, wherein the first dielectric layer comprises silicon oxide.

13. The high voltage semiconductor device of claim 10, wherein the second dielectric layer comprises silicon nitride.

14. The high voltage semiconductor device of claim 10, wherein the pair of spacers comprises a material selected from the group consisting essentially of a nitrogen-containing dielectric, oxygen-containing dielectric, tetraethylorthosilicate (TEOS), and combinations thereof.

15. The high voltage semiconductor device of claim 10, wherein the first doped region comprises a dopant concentration between about $10^{12}$ cm$^{-3}$ and $10^{13}$ cm$^{-3}$, and wherein the first doped region is about 20 angstroms and 2000 angstroms deep.

16. The high voltage semiconductor device of claim 10, wherein the second doped region comprises a dopant concentration between about $10^{14}$ cm$^{-3}$ and $10^{16}$ cm$^{-3}$, and wherein the second doped region is between about 20 angstroms and 200 angstroms deep.

* * * * *